United States Patent
Huang et al.

(10) Patent No.: US 8,115,542 B2
(45) Date of Patent: Feb. 14, 2012

(54) VARIABLE FREQUENCY CLASS-D AMPLIFIER, CONTROL METHOD THEREOF, AND RAMP GENERATOR THEREFOR

(75) Inventors: Pei-Cheng Huang, Zhubei (TW); Jwin-Yen Guo, Jhubei (TW); Shao-Ming Sun, Zhubei (TW)

(73) Assignee: Richtek Technology Corp., Hsinchu (TW)

( * ) Notice: Subject to any disclaimer, the term of this patent is extended or adjusted under 35 U.S.C. 154(b) by 16 days.

(21) Appl. No.: 12/857,855

(22) Filed: Aug. 17, 2010

(65) Prior Publication Data
US 2011/0043283 A1 Feb. 24, 2011

(30) Foreign Application Priority Data
Aug. 20, 2009 (TW) .............................. 98128086 A

(51) Int. Cl.
*H03F 3/38* (2006.01)
(52) U.S. Cl. ....................... 330/10; 330/251; 330/207 A

(58) Field of Classification Search .................... 330/10, 330/251, 207 A
See application file for complete search history.

(56) References Cited

U.S. PATENT DOCUMENTS

| 4,213,103 | A | * | 7/1980 | Birt ................................ 455/108 |
| 5,450,036 | A | * | 9/1995 | Nishioka et al. ............... 330/273 |
| 6,229,389 | B1 | * | 5/2001 | Pullen et al. .................... 330/10 |
| 7,010,271 | B2 | * | 3/2006 | Melanson ........................ 455/71 |
| 7,068,095 | B2 | * | 6/2006 | Bernardon ......................... 330/9 |
| 7,400,194 | B2 | * | 7/2008 | Kuehnel ......................... 330/251 |
| 7,990,215 | B2 | * | 8/2011 | Soenen et al. ................. 330/251 |

* cited by examiner

*Primary Examiner* — Patricia Nguyen
(74) *Attorney, Agent, or Firm* — Rosenberg, Klein & Lee

(57) ABSTRACT

A class-D amplifier includes a ramp generator to provide a ramp signal having a frequency varying with an audio input signal, and a modulator to convert the audio input signal to a pulse width modulation signal according to the ramp signal for a driver to drive a load device. The varying frequency of the ramp signal will cause the frequency of the pulse width modulation signal unfixed and consequently improves EMI issue.

24 Claims, 3 Drawing Sheets

VARIABLE FREQUENCY CLASS-D AMPLIFIER, CONTROL METHOD THEREOF, AND RAMP GENERATOR THEREFOR

FIELD OF THE INVENTION

The present invention is related generally to a class-D amplifier and, more particularly, to circuitry and method for improving the electromagnetic interference (EMI) issue in class-D amplifier applications.

BACKGROUND OF THE INVENTION

Due to the development of compact handheld electronic devices, for example cell phone, MP3, PDA, iPod and LCD TV etc., towards to light, thin, short and small, highly efficient class-D amplifiers attract more and more attention. As shown in FIG. 1, a class-D amplifier 10 typically includes a ramp generator 14, a modulator 16, and a driver 18. The ramp generator 14 provides a ramp signal Vramp, and the modulator 16 converts an audio frequency input signal Vaudio into a pulse width modulation signal PWM according to the ramp signal Vramp, for the driver 18 to drive a load device 12. EMI performance is an important issue in class-D amplifiers, therefore many methods for improving EMI issue have been proposed, one of which is spread spectrum methodology.

Current spread spectrum methods, for example U.S. Patent Publication Nos. 2004/0232978 and 2007/0132509 and U.S. Pat. No. 6,847,257, use random circuit to provide a random number to change the frequency of the ramp signal Vramp and thereby generate an unpredictable PWM frequency to drive the audio amplifier. However, these arts require an extra random generator to provide a random number. Furthermore, a high audio fidelity requires a higher frequency ramp signal Vramp when the amplitude of the audio frequency input signal Vaudio is large, and requires a lower frequency ramp signal Vramp when the amplitude of the audio frequency input signal Vaudio is small. However, the random numbers provided by a random generator are unpredictable, and in consequence a lower frequency ramp signal Vramp may be generated when the amplitude of the audio frequency input signal Vaudio is large, thereby resulting in distortion.

Therefore, it is desired a distortion reduced class-D amplifier without a random generator.

SUMMARY OF THE INVENTION

An object of the present invention is to provide a variable frequency class-D amplifier and a method thereof which can reduce distortion without a random generator.

Another object of the present invention is to provide a ramp generator and a method thereof for variable frequency class-D amplifiers.

According to the present invention, a variable frequency class-D amplifier includes a ramp generator to generate a ramp signal having a frequency varying with an audio frequency input signal, and a modulator to convert the audio frequency input signal to a variable frequency pulse width modulation signal according to the ramp signal.

According to the present invention, a control method of a variable frequency class-D amplifier generates a ramp signal having a frequency varying with an audio frequency input signal first, and converts the audio frequency input signal to a variable frequency pulse width modulation signal according to the ramp signal.

According to the present invention, a ramp generator for a variable frequency class-D amplifier having a modulator to convert an audio frequency input signal to a pulse width modulation signal includes a capacitor, a current supply circuit to provide a charging current varying with the audio frequency input signal to charge the capacitor, and a charge/discharge controller to control charging and discharging of the capacitor to generate the ramp signal.

According to the present invention, a ramp generating method for a variable frequency class-D amplifier having a modulator to convert an audio frequency input signal to a pulse width modulation signal according to a ramp signal includes providing a variable charging current according to the audio frequency input signal to charge a capacitor, and controlling charging and discharging of the capacitor to generate the ramp signal.

The present invention determines the frequency of a ramp signal according to an audio frequency input signal and consequently does not require an extra random generator.

BRIEF DESCRIPTION OF DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
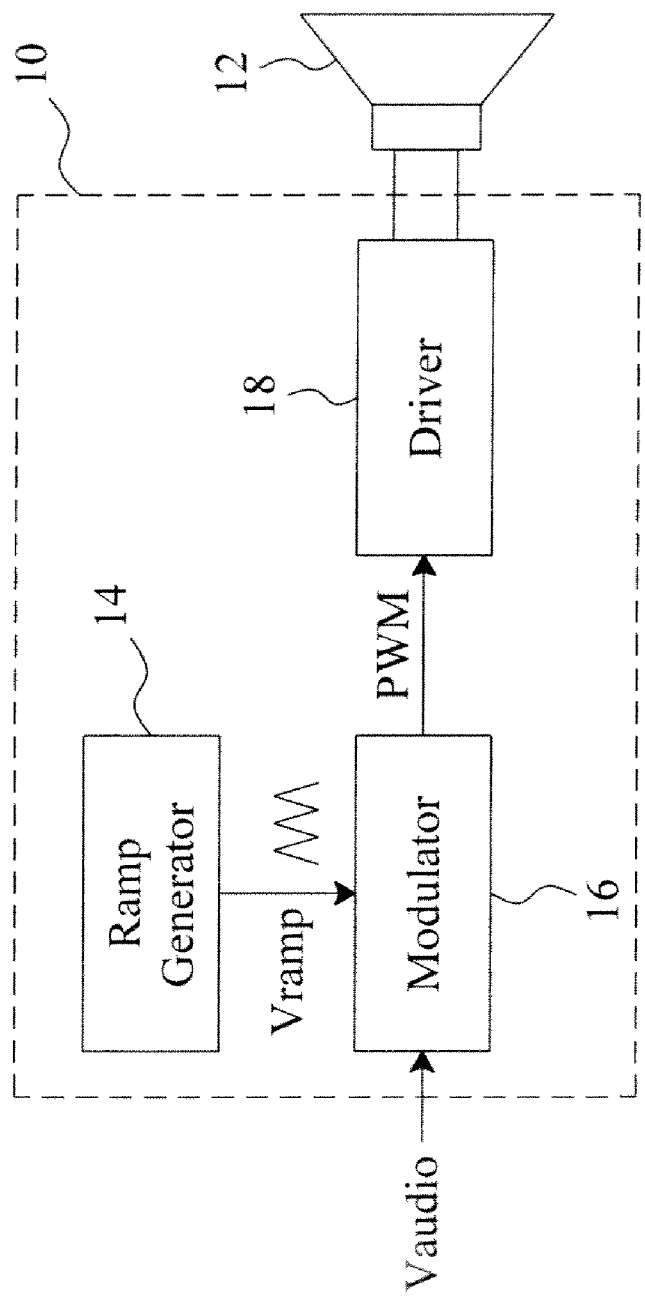
FIG. 1 is a block diagram of a typical class-D amplifier.
Figure 2:
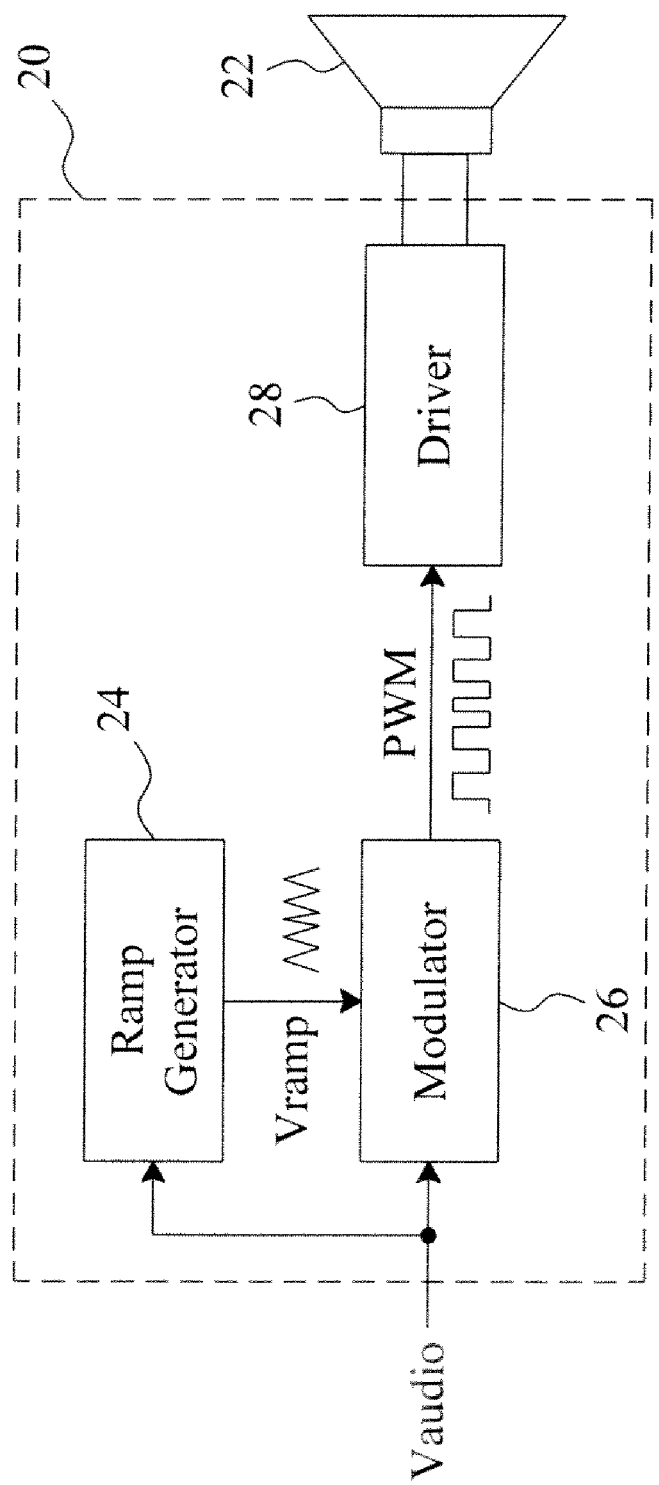
FIG. 2 is a block diagram of a variable frequency class-D amplifier according to the present invention.

In fact, the frequency and amplitude of sound both can be regarded as random numbers and therefore, the audio frequency input signal of a class-D amplifier can be used to obtain random numbers for spread spectrum methodology. Referring to FIG. 2, a variable frequency class-D amplifier 20 according to the present invention includes a ramp generator 24, a modulator 26, and a driver 28. The ramp generator 24 generates a ramp signal Vramp according to an audio frequency input signal Vaudio, whose frequency varies with the audio frequency input signal Vaudio. The modulator 26 converts the audio frequency input signal Vaudio to a pulse width modulation signal PWM according to the ramp signal Vramp, whose frequency varies with the frequency of the ramp signal Vramp. The driver 28 drives a load device 22 according to the pulse width modulation signal PWM.

Figure 3:
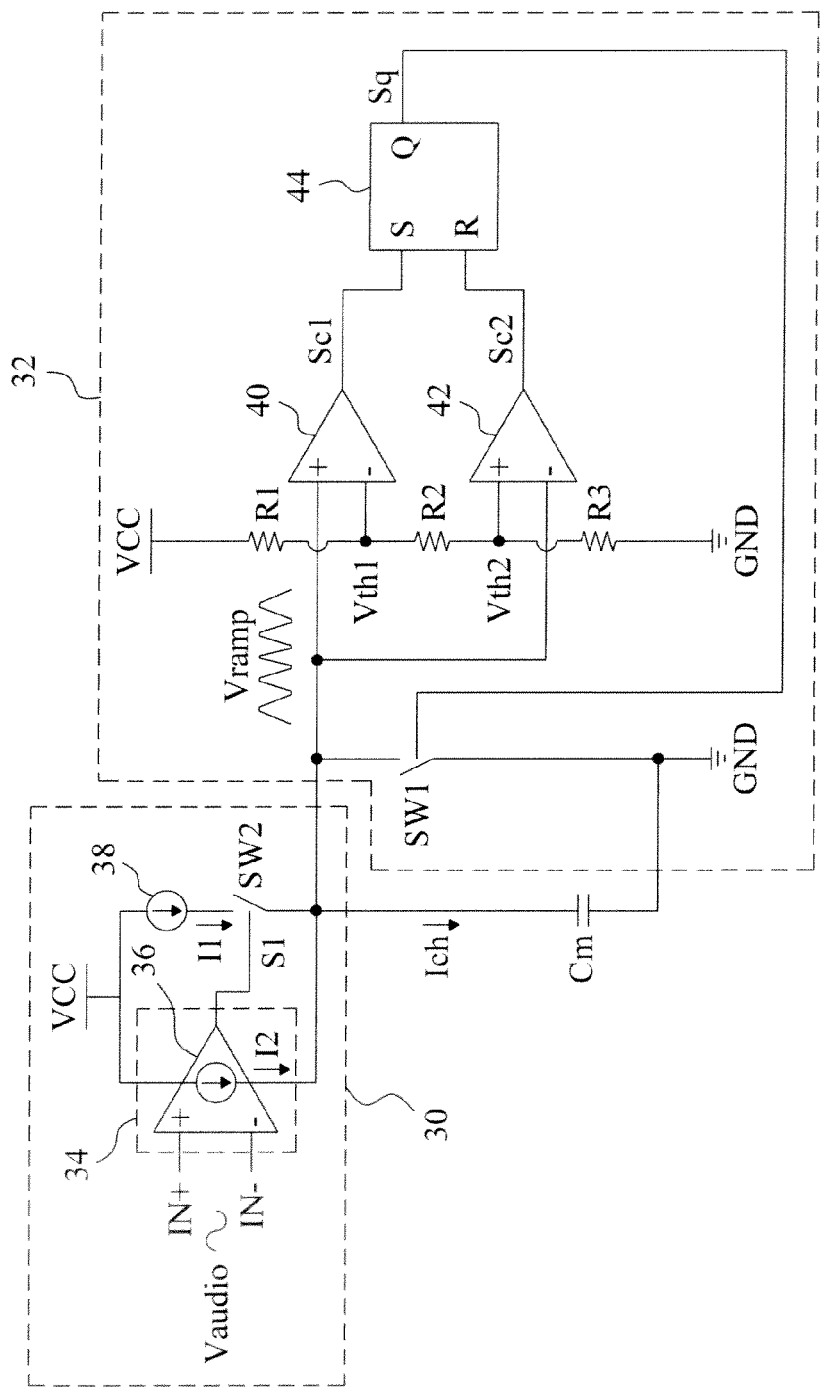
FIG. 3 is a circuit diagram of a ramp generator according to the present invention.

FIG. 3 is a circuit diagram of an embodiment for the ramp generator 24 shown in FIG. 2, which includes a capacitor Cm, a current supply circuit 30, and a charge/discharge controller 32. The current supply circuit 30 supplies a charging current Ich to charge the capacitor Cm. In the current supply circuit 30, a current source 38 provides a current I1, a switch SW2 is connected between the current source 38 and the capacitor Cm and controlled by a signal S1, and a voltage-to-current converter 34 generates a current I2 and the signal S1 according to the audio frequency input signal Vaudio. The voltage-to-current converter 34 includes a transconductance amplifier 36 to determine the current I2 according to the amplitude of the audio frequency input signal Vaudio. Since the current I2 varies with the audio frequency input signal Vaudio and the charging current Ich=I1+I2, the charging current Ich also varies with the audio frequency input signal Vaudio. In absence of the audio frequency input signal Vaudio, the transconductance amplifier 36 turns off the switch SW2 to shut down the ramp generator 24, thereby reducing the quiescent current consumption; meanwhile, the modulator will also stop operating. The charge/discharge controller 32 controls charging and discharging of the capacitor Cm to generate the ramp signal Vramp. In the charge/discharge controller 32, a switch SW1 is parallel connected to the capacitor Cm, resistors R1, R2, and R3 divide a supply voltage Vcc to generate threshold values Vth1 and Vth2, a comparator 40 compares the ramp signal Vramp with the threshold value Vth1 to generate a comparison signal Sc1, a comparator 42 compares the ramp signal Vramp with the threshold value Vth2 to generate a comparison signal Sc2, and responsive to the comparison signals Sc1 and Sc2, a flip-flop 44 generates a control signal Sq to switch the switch SW1 to control charging and discharging of the capacitor Cm. The flip-flop 44 turns on the switch SW1 to discharge the capacitor Cm when the ramp signal Vramp is greater than the threshold value Vth1 and turns off the switch SW1 to charge the capacitor Cm when the ramp signal Vramp is less than the threshold value Vth2.

Since the class-D amplifier 20 shown in FIG. 2 uses the audio frequency input signal Vaudio as a random number source for achieving spread spectrum, it does not require an extra random generator. In addition, in the ramp generator 24, when the amplitude of the audio frequency input signal Vaudio is greater, the current I2 is also greater, and thus the frequency of the ramp signal Vramp is higher; and when the amplitude of the audio frequency input signal Vaudio is smaller, the current I2 is also smaller, and thus the frequency of the ramp signal Vramp is lower. Hence, this class-D amplifier 20 has better fidelity effect.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A variable frequency class-D amplifier comprising:
  a ramp generator for generating a ramp signal having a frequency varying with an input signal; and
  a modulator connected to the ramp generator, for converting the input signal to a variable frequency pulse width modulation signal according to the ramp signal for driving a load device.

2. The variable frequency class-D amplifier of claim 1, wherein the ramp generator comprises:
  a capacitor;
  a current supply circuit connected to the capacitor, operative to supply a variable charging current according to the input signal for charging the capacitor; and
  a charge/discharge controller connected to the capacitor, operative to control charging and discharging of the capacitor to generate the ramp signal.

3. The variable frequency class-D amplifier of claim 1, wherein the frequency of the ramp signal varies with an amplitude of the input signal.

4. The variable frequency class-D amplifier of claim 2, wherein the current supply circuit comprises:
  a current source for providing a first current to charge the capacitor when being coupled to the capacitor; and
  a voltage-to-current converter connected to the capacitor, operative to provide a second current varying with the amplitude of the input signal to charge the capacitor;
  wherein the first and second currents are combined to be the charging current.

5. The variable frequency class-D amplifier of claim 4, wherein the voltage-to-current converter comprises a transconductance amplifier receiving the input signal and generating the second current.

6. The variable frequency class-D amplifier of claim 4, wherein the current supply circuit further comprises a switch connected between the current source and the capacitor and turned off in absence of the input signal.

7. The variable frequency class-D amplifier of claim 2, wherein the charge/discharge controller comprises:
  a switch parallel connected to the capacitor;
  a first comparator connected to the capacitor for asserting a first comparison signal when the ramp signal is greater than a first threshold value;
  a second comparator connected to the capacitor for asserting a second comparison signal when the ramp signal is less than a second threshold value; and
  a flip-flop connected to the switch and the first and second comparators, for generating a control signal responsive to the first and second comparison signals to switch the switch, to control charging and discharging of the capacitor.

8. A ramp generator for a variable frequency class-D amplifier including a modulator to convert an input signal to a pulse width modulation signal according to a ramp signal, the ramp generator comprising:
  a capacitor;
  a current supply circuit connected to the capacitor, operative to supply a charging current varying with the input signal for charging the capacitor; and
  a charge/discharge controller connected to the capacitor, operative to control charging and discharging of the capacitor to generate the ramp signal.

9. The ramp generator of claim 8, wherein the ramp signal has a frequency varying with an amplitude of the input signal.

10. The ramp generator of claim 8, wherein the current supply circuit comprises;
  a current source for providing a first current to charge the capacitor when being coupled to the capacitor; and
  a voltage-to-current converter connected to the capacitor, operative to provide a second current varying with the amplitude of the input signal to charge the capacitor;
  wherein the first and second currents are combined to be the charging current.

11. The ramp generator of claim 10, wherein the voltage-to-current converter comprises a transconductance amplifier receiving the input signal and generating the second current.

12. The ramp generator of claim 10, wherein the current supply circuit further comprises a switch connected between the current source and the capacitor and turned off in absence of the input signal.

13. The ramp generator of claim 8, wherein the charge/discharge controller comprises:
  a switch parallel connected to the capacitor;
  a first comparator connected to the capacitor for asserting a first comparison signal when the ramp signal is greater than a first threshold value;
  a second comparator connected to the capacitor for asserting a second comparison signal when the ramp signal is less than a second threshold value; and
  a flip-flop connected to the switch and the first and second comparators, for generating a control signal responsive to the first and second comparison signals to switch the switch, to control charging and discharging of the capacitor.

14. A control method of a variable frequency class-D amplifier, comprising the steps of:

(A) generating a ramp signal having a frequency varying with an input signal; and (B) converting the input signal to a variable frequency pulse width modulation signal according to the ramp signal for driving a load device.

15. The control method of claim 14, wherein the step (A) comprises the step of varying the frequency of the ramp signal with an amplitude of the input signal.

16. The control method of claim 14, wherein the step (A) comprises the steps of:

supplying a variable charging current according to the input signal for charging a capacitor; and controlling charging and discharging of the capacitor to generate the ramp signal.

17. The control method of claim 16, wherein the step of supplying a variable charging current according to the input signal for charging a capacitor comprises the steps of:

providing a constant first current; and providing a second current varying with an amplitude of the input signal to combine with the first current to be the charging current.

18. The control method of claim 16, wherein the step of controlling charging and discharging of the capacitor to generate the ramp signal comprises the steps of:

discharging the capacitor when the ramp signal is greater than a first threshold value; and charging the capacitor when the ramp signal is less than a second threshold value.

19. The control method of claim 14, further comprising the step of stopping supplying the ramp signal in absence of the input signal.

20. A ramp generating method for a variable frequency class-D amplifier including a modulator to convert an input signal to a pulse width modulation signal according to a ramp signal, the ramp generating method comprising the steps of:

(A) supplying a variable charging current according to the input signal for charging a capacitor; and (B) controlling charging and discharging of the capacitor to generate the ramp signal.

21. The ramp generating method of claim 20, wherein the step (A) comprises the step of varying the frequency of the ramp signal with an amplitude of the input signal.

22. The ramp generating method of claim 20, wherein the step (A) comprises the steps of:

providing a constant first current; and providing a second current varying with an amplitude of the input signal to combine with the first current to be the charging current.

23. The ramp generating method of claim 20, wherein the step (B) comprises the steps of:

discharging the capacitor when the ramp signal is greater than a first threshold value; and charging the capacitor when the ramp signal is less than a second threshold value.

24. The ramp generating method of claim 20, further comprising the step of stopping supplying the ramp signal in absence of the input signal.

* * * * *